United States Patent
Griffith et al.

[11] Patent Number: 5,966,051
[45] Date of Patent: Oct. 12, 1999

[54] LOW VOLTAGE MEDIUM POWER CLASS C POWER AMPLIFIER WITH PRECISE GAIN CONTROL

[75] Inventors: Scott A. Griffith, San Clemente; San Chin, La Palma, both of Calif.

[73] Assignee: Conexant Systems, Inc., Newport Beach, Calif.

[21] Appl. No.: 09/064,114

[22] Filed: Apr. 21, 1998

[51] Int. Cl.$^6$ .................................................. H03G 3/10
[52] U.S. Cl. ......................... 330/285; 330/145; 330/311
[58] Field of Search .................................. 330/285, 282, 330/86, 144, 145, 311

[56] References Cited

U.S. PATENT DOCUMENTS

| | | | |
|---|---|---|---|
| 3,451,003 | 6/1969 | Rheinfelder | 330/21 |
| 3,723,894 | 3/1973 | Benenati | 330/29 |
| 3,902,077 | 8/1975 | Takemura et al. | 307/237 |

*Primary Examiner*—Robert Pascal
*Assistant Examiner*—Henry Choe
*Attorney, Agent, or Firm*—Price Gess & Ubell

[57] ABSTRACT

A non-linear power amplifier for amplifying a constant envelope phase modulation component of a modulation signal and combining an amplitude envelope component of the modulation signal into the amplified constant envelope phase modulation component and method for performing the same. The power amplifier receives a constant envelope phase modulation signal and transmits the signal through a pair of amplifier stages which are impedance matched together. The first amplifier stage has a fixed gain which drives an impedance load and, in turn, the second amplifier stage. A variable resistance device is connected between a base of an amplifying transistor in the second amplifier stage and electrical ground for variably controlling the gain of the second amplifier stage by variably controlling the base-to-ground resistance of the amplifying transistor in the second amplifier stage. By varying the base-to-ground resistance of the amplifying transistor, the pulse width, gain, and power output of the constant envelope phase modulation signal can be controlled. The amplitude envelope component of the modulation signal is then reintroduced into the amplified constant envelope phase modulation component at a low current point between the base of the amplifying transistor and the variable resistance device, which enables the power amplifier to be operated with a low current consumption.

14 Claims, 4 Drawing Sheets

LOW VOLTAGE MEDIUM POWER CLASS C POWER AMPLIFIER WITH PRECISE GAIN CONTROL

BACKGROUND OF THE INVENTION

1. Field of the Invention

The present invention relates generally to a low voltage, non-linear power amplifier, and specifically to an efficient, non-linear power amplifier which amplifies a constant envelope phase modulation component of a modulation signal and combines an amplitude envelope of the modulation signal with the amplified constant envelope phase modulation signal at the output of the power amplifier.

2. Description of Related Art

Digital wireless phones have gained widespread use throughout the world. These phones typically utilize cellular network systems, such as PHS, having base stations serving a predetermined area or cell, where each base station has a certain number of channels for communicating with handsets within that cell. The transmitted signals undergo some type of modulation to transmit a signal on an available channel within the predetermined cell, where the modulated signals are amplified to a desired power level for transmission. The power levels of the signals transmitted by the handsets are precisely controlled by power amplifiers in order to prevent signal interference from occurring at the base station with signals received from other handsets, while also ensuring a quality signal is transmitted. Digital modulators, such as a π/4 differential quadrature phase shift-keying (DQPSK) modulator, are typically used for PHS handsets and other digital wireless phones. A π/4 DQPSK modulated signal contains both phase and amplitude information, which requires the transmit chain of the handset to maintain a certain level of linearity in order to meet system requirements of adjacent channel power and transmit accuracy. The linearity requirements on the power amplifier require it to be operated in a linear power mode, such as a Class AB mode. Linear power modes are less efficient than other power modes and require a large amount of current to operate. Thus, the large amount of current consumed by a telephone handset using a linear power amplifier reduces the talk time of the handset or requires the use of a large battery.

Typically, data to be transmitted by the telephone handset is fed through a differential encoder, where an in-phase component (I) and a quadrature component (Q) of the modulation signal to be transmitted are created. The I and Q components are then passed through digital filters which give the modulation a particular shape. The resultant I and Q filtered signals are then modulated at a radio frequency for transmission and combined as a phase modulated signal. The phase modulated signal is then amplified to bring the signal to a desired power level for transmission.

This type of conventional power amplification requires a linear power amplifier to be used in order to maintain the requisite level of linearity, which undesirably operates the handset in a non-efficient manner. The talktime of the handset could be increased if a more efficient, non-linear power amplifier were utilized in the transmit architecture. However, the in-phase and quadrature components of the modulation signal and, thus, the phase modulated signal will have both phase and amplitude modulation (AM) components. Thus, both the phase and amplitude modulation components of the signals are fed through the power amplifier. When an AM envelope signal is amplified with a non-linear power amplifier, the AM envelope on the output of the amplifier is distorted due to the spectral spreading of the AM envelope signals which will occur in the power amplifiers. Therefore, non-linear power amplifiers can not be used with current digital telephones without causing distortion in the modulation signal due to the presence of the AM envelope.

There is a need for a non-linear power amplifier which amplifies a phase modulated signal to a desired power level without amplifying the amplitude envelope of the phase modulated signal. Moreover, there is a need for a non-linear power amplifier which reintroduces the amplitude envelope into the phase modulated signal at the output of the power amplifier in an efficient manner to maintain a low current consumption by the non-linear power amplifier.

OBJECTS AND SUMMARY OF THE INVENTION

It is a primary object of the present invention to overcome the aforementioned shortcomings associated with the prior art.

Another object of the present invention is to provide a power amplifier which operates in a non-linear mode to maximize its efficiency A further object of the present invention is to provide a non-linear power amplifier which amplifies only a constant envelope phase component in order to avoid distortion of the amplified signal.

Yet another object of the present invention is to provide a non-linear power amplifier which reintroduces the amplitude envelope of a modulation signal with the amplified constant envelope phase modulation signal in the output of the power amplifier.

It is another object of the present invention to provide a non-linear power amplifier which reintroduces the amplitude envelope of the modulation signal at a low current point in the power amplifier in order to maintain efficient, low current consumption by the power amplifier.

These as well as additional objects and advantages of the present invention are achieved by providing a non-linear power amplifier for amplifying a constant envelope phase modulation component of a modulation signal and combining an amplitude envelope component of the modulation signal into the amplified constant envelope phase modulation component and method for performing the same. The power amplifier receives a constant envelope phase modulation signal and transmits the signal through a pair of amplifier stages which are impedance matched together. The first amplifier stage has a fixed gain which drives an impedance load and, in turn, the second amplifier stage. A variable resistance device is connected between a base of an amplifying transistor in the second amplifier stage and electrical ground for variably controlling the gain of the second amplifier stage by variably controlling the base-to-ground resistance of the amplifying transistor in the second amplifier stage. By varying the base-to-ground resistance of the amplifying transistor, the pulse width, gain, and power output of the constant envelope phase modulation signal can be controlled. The amplitude envelope component of the modulation signal is then reintroduced into the amplified constant envelope phase modulation component at a low current point between the base of the amplifying transistor and the variable resistance device, which enables the power amplifier to be operated with a low current consumption.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings in which the reference numerals designate like parts throughout the figures thereof and wherein:

DETAILED DESCRIPTION OF THE PREFERRED EMBODIMENTS

The following description is provided to enable any person skilled in the art to make and use the invention and sets forth the best modes contemplated by the inventors of carrying out their invention. Various modifications, however, will remain readily apparent to those skilled in the art, since the general principles of the present invention have been defined herein specifically to provide a non-linear power amplifier system for amplifying only a constant envelop phase modulation component of a modulation signal and reintroducing an amplitude envelop component of the modulation signal to the amplified constant envelop phase modulation component.

Figure 1:
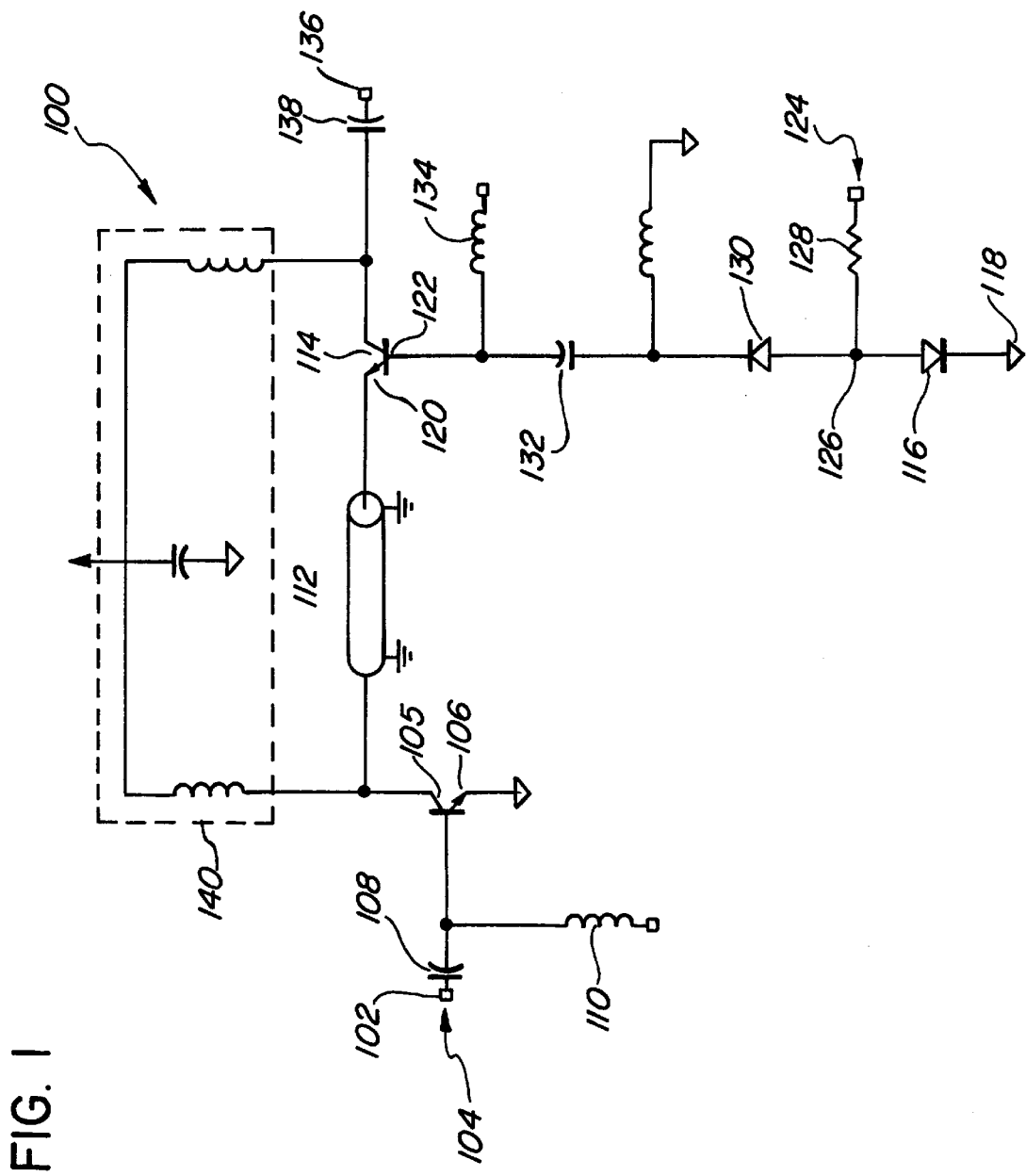
FIG. 1 is a circuit diagram of a preferred embodiment of the non-linear power amplifier of the present invention.

Referring now to FIG. 1, a partial circuit diagram for a preferred embodiment of the non-linear power amplifier 100 of the present invention is illustrated. This circuit includes a number of advanced features, but the principles of present invention are equally applicable to other circuits. The non-linear power amplifier 100 is designed to amplify a constant envelop signal and combine a signal having a non-constant envelop with the constant envelop signal after the point of amplification in order to prevent distortion of the amplified signal. Signals having a constant envelope may be amplified without distortion by non-linear power amplifiers, since a non-linear power amplifier will not cause spectral spreading in a constant envelope signal. Therefore, the non-linear power amplifier 100 is designed to amplify a modulation signal which is divided into a constant envelope component and a non-constant envelop component. For instance, in wireless systems for communicating data, such as a PHS telephone handset or other similar wireless data transmission device, a modulation signal is transmitted containing the desired data, where the modulation signal can be separated into a constant envelop phase modulation signal and an amplitude envelop signal. The constant envelop phase modulation signal is amplified by the non-linear power amplifier 100 and the amplitude envelop of the modulation signal is then reintroduced in the output of the non-linear power amplifier 100 after the point of amplification to recreate the modulation signal, so that the amplitude envelop is not amplified by power amplifier 100. Thus, distortion of the modulation signal can be minimized by only amplifying the constant envelope phase modulation component of the modulation signal.

The non-linear power amplifier 100 includes a driver stage and an amplifier output stage. An input 102 to the driver stage is provided for receiving the constant envelope phase modulation component 104 of a modulation signal. The driver stage includes a driver amplifier 106 connected to the first input 102 through a capacitance 108. A bias network (not shown) for the driver amplifier 106 is also connected to the driver amplifier 106 through an inductance 110. Driver amplifier 106 is preferably a substantially linear amplifier, such as a Common Emitter amplifier operating in either a Class A or Class AB mode, having a predetermined fixed gain. However, any amplifier having similar driving characteristics may be utilized with the present invention. Driver amplifier 106 drives a moderate impedance load 112 connected thereto, which matches the impedance between the driver stage and amplifier output stage of the non-linear power amplifier 100. The collector 105 of the driver amplifier 106 possesses a higher impedance than an emitter 120 in the amplifier output stage. The impedance load 112 performs an impedance transformation of 90 degrees to transduce the impedance to a relatively low source impedance at the amplifier output stage to match the impedance difference between the driver stage and the amplifier output stage. While the impedance load 112 is illustrated as a transmission line, it is understood that any impedance matching device may be used to match the impedance of the driver stage with the amplifier output stage.

The amplifier output stage includes a non-linear final amplifier 114 for controlling the gain of the constant envelop phase modulation signal 104. Final amplifier 114 is preferably a Common Base amplifier operating in a non-linear Class C or Class D mode, wherein the emitter 120 of the final amplifier 114 is driven by the low source impedance from impedance load 112. A capacitor/inductor network 140 is connected between the collectors of amplifiers 106 and 114. A variable resistance device 116 is positioned between a base 122 of final amplifier 114 and electrical ground 118 for controlling the gain of the final amplifier 114. The variable resistance device 116 may comprise a PIN diode or any other similar device that enables the base-to-ground resistance to be variably controlled. In the case of a PIN diode, the on resistance of the PIN diode is changed to change the pulse width, gain, and output power of the final amplifier 114. The base-to-ground resistance of the final amplifier 114 and the input resistance of the emitter 120 of the final amplifier 114 are interrelated, where the input resistance of the emitter 120 changes as the base-to-ground resistance is changed. The base-to-ground resistance of the final amplifier 114 and the input resistance of the emitter 120 are inversely proportional, so that the emitter 120 resistance decreases as the base-to-ground resistance increases and vice versa. The gain of the final amplifier 114 is characterized by the following relationship:

Gain=(output resistance of the collector)/(input resistance of the emitter).

Thus, the gain of the final amplifier 114 can be controlled by varying the input resistance of the emitter 120, which is varied by changing the base-to-ground resistance of the final amplifier 114. By varying the base-to-ground resistance of the final amplifier 114, the pulse width, gain, and power output of the constant envelope phase modulation signal 104 can be variably controlled.

To better appreciate the problems solved by the present invention, it useful to briefly review the challenges faced in effectively reintroducing the amplitude envelope into the constant envelope phase modulation signal. Amplitude modulation requires precise fine gain control of at least 14 dB. In order to provide this precise gain control, the non-linear power amplifier 100 could be followed with a gain control device, such as a pin diode device or a 3 dB attenuater. However, the power absorption capability required of a pin diode device and the nominal insertion loss of a 3 dB attenuater make it undesirable to follow the power amplifier with a gain control device of these types. Alternatively, there have been attempts to provide a modulation on the collector of the final amplifier in a power amplifier in order to reintroduce the amplitude envelope, but these types of systems are not practical as they require a more complex circuit arrangement. Furthermore, fine gain control is difficult to achieve by changing the collector voltage to control the gain of the final amplifier as performed with collector modulation techniques. Collector modulation is good for a pulse system where a wide range of gain control is desired, but a narrow range of gain control is required in the present invention to reintroduce the amplitude modulation. Therefore, the non-linear power amplifier 100 of the present invention utilizes the variable resistance device 116 to vary the base-to-ground resistance in final amplifier 114 in order to provide the required precise gain control.

The non-linear power amplifier 100 utilizes a Common Base amplifier as the final amplifier 114 due to the advantages of its low current consumption by operating in a non-linear mode. Further, the Common Base amplifier provides a low current point 126 to introduce the amplitude envelop 124 back into the constant envelop phase modulation signal 104, thus maintaining the efficiency of the power amplifier 100. The amplitude envelope component 124 is reintroduced into the amplified constant envelope phase modulation component 104 at the low current point 126 between the base 122 of the final amplifier 114 and the variable resistance device 116. The amplitude envelope component 124 passes through a resistor 128, a diode 130, and a capacitor 132 as it travels to final amplifier 114. Diode 130 is provided to handle any current leakages, where diode 130 and variable resistance device 116 will work against one another to cancel the influx of current. A final bias network (not shown) is connected to the base 122 of the final amplifier 114 through an inductance 134. This enables the final amplifier 114 to operate in an efficient non-linear mode and the power amplifier to be operated with low current consumption. Once the amplitude envelope 124 is reintroduced into the amplified constant envelope phase modulation signal 104, all of the power is converted to be in-band to produce a clean spectrum which is output as the amplified modulation signal at 136 after passing through capacitor 138.

Figure 2:
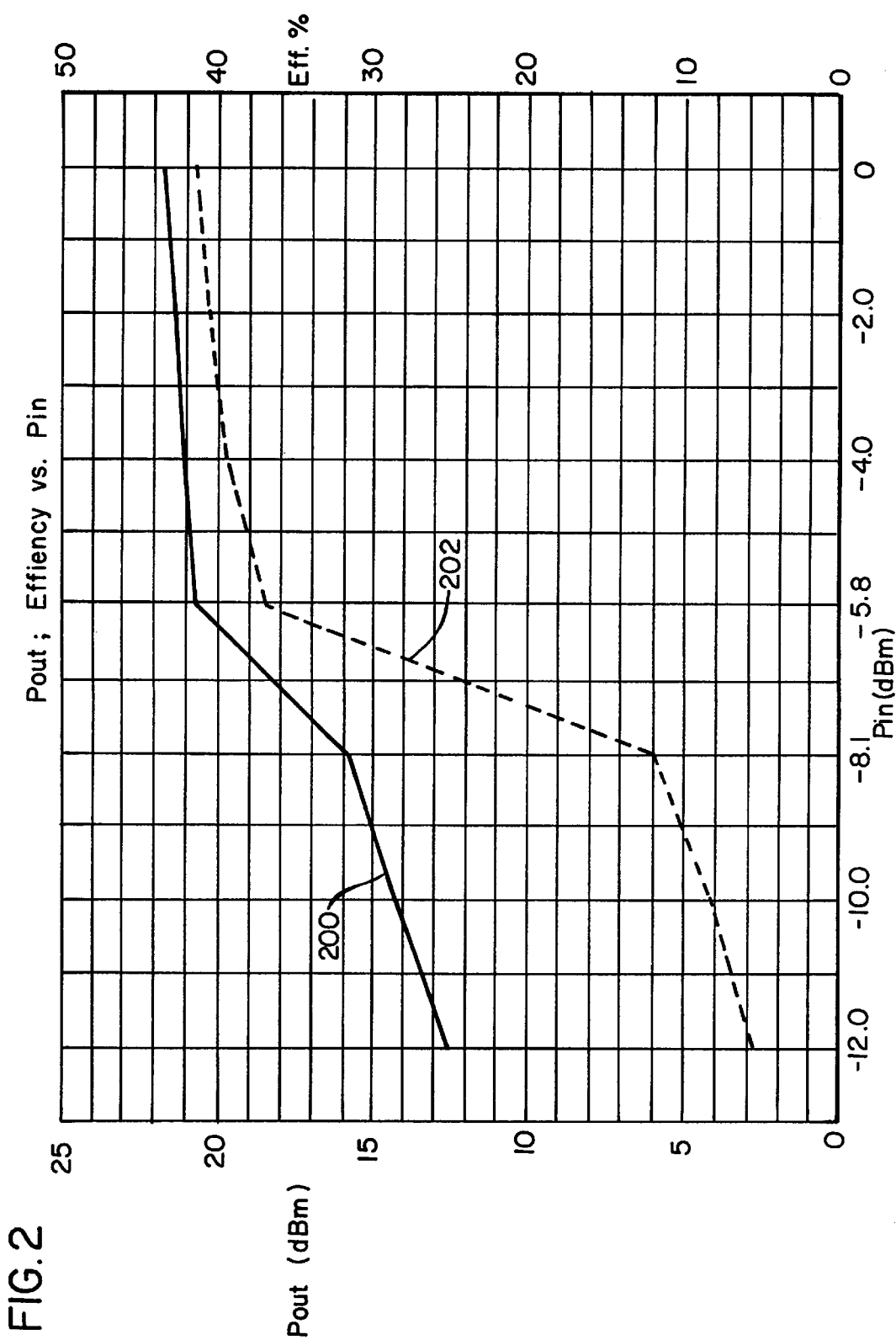
FIG. 2 is a graphical illustration of the power output and efficiency of the non-linear power amplifier of the present invention as a function of the input power.
Figure 3:
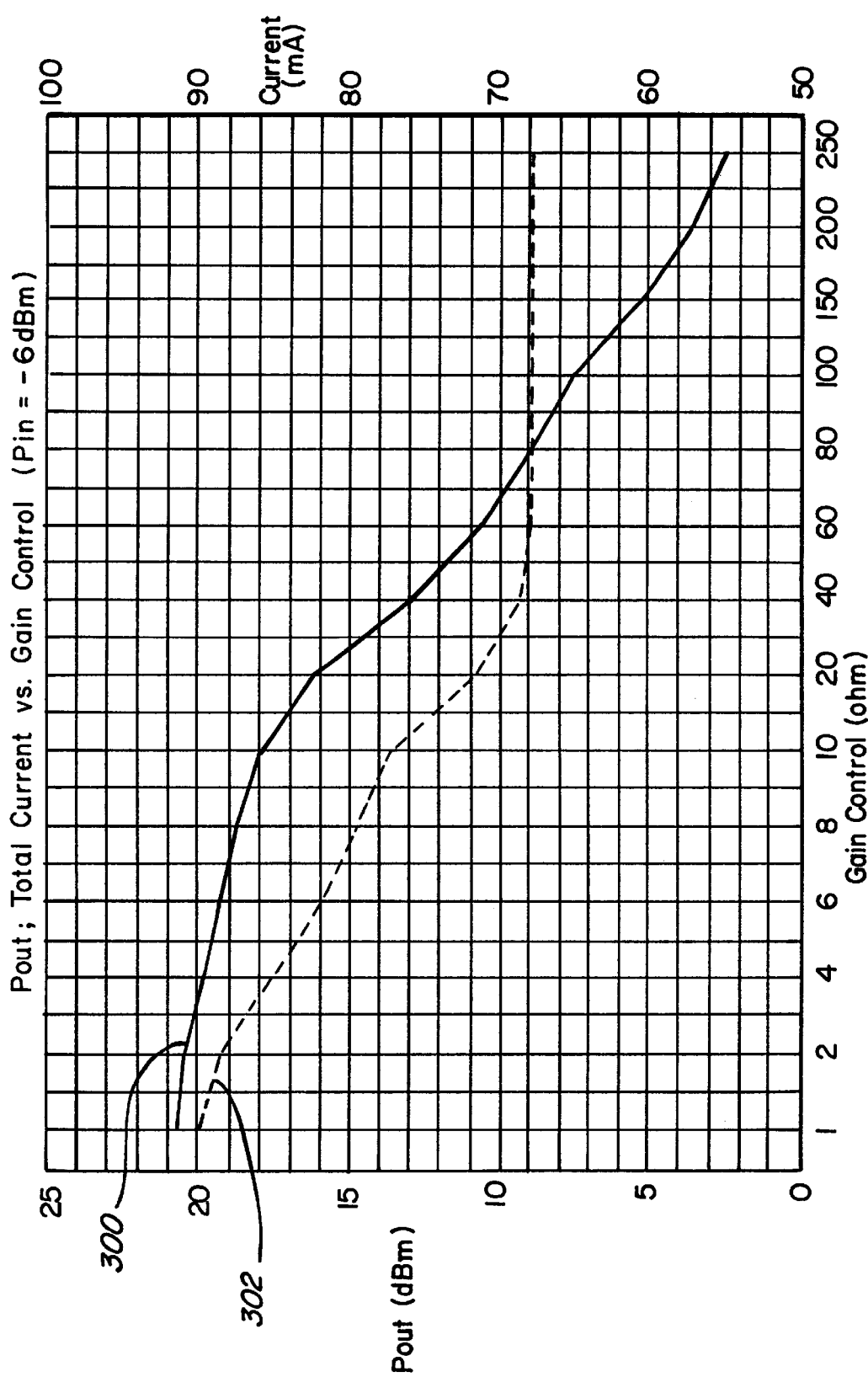
FIG. 3 is a graphical illustration of the output power and total current consumed by the non-linear power amplifier of the present invention as a function of gain control resistance.

In test simulations using the structure of the non-linear power amplifier 100, the non-linear power amplifier 100 was found to operate very close to desired output power level of +21 dBm with a gain control range greater than 14 dB. Referring now to FIG. 2, the output power level is illustrated as a function of the input drive level by line 200. The efficiency of the power amplifier 100 is further illustrated in FIG. 2 as a function of the input drive level by line 202. As can be seen, the efficiency of the power amplifier 100 ranges from 36% to 41% for input drive levels varying from −6 to 0 dBm, where the output power level ranges from +20.7 to +21.6 dBm over this same input drive range. Referring now to FIG. 3, the output power level is illustrated as a function of the gain control (resistance of the variable resistance device 116) by line 300. The total current used by the power amplifier 100 is illustrated by line 302 as a function of gain control. The power amplifier 100 possesses a gain control of 18 dB for resistances from the variable resistance device 116 varying from 1 to 250 ohms. The output power of the non-linear power amplifier as a function of the gain control variable resistance is shown in Table 1:

TABLE 1

| $R_{var}$ | $I_{bias}$ | $I_{bat}$ | $V_o$ | $P_{disp}$ | $P_{out}$ | | Eff. |
|---|---|---|---|---|---|---|---|
| (ohm) | (mA) | (mA) | (Vp) | mW | mW | dBm | % |
| 1 | 22.9 | 67.1 | 3.422 | 317.13 | 117.10 | 20.69 | 36.93 |
| 2 | 22.7 | 65.9 | 3.334 | 312.15 | 111.16 | 20.46 | 35.61 |
| 4 | 22.4 | 62.9 | 3.133 | 300.36 | 98.16 | 19.92 | 32.68 |
| 6 | 22.2 | 59.8 | 2.938 | 288.54 | 86.32 | 19.36 | 29.92 |
| 8 | 22.2 | 57.5 | 2.775 | 280.26 | 77.01 | 18.87 | 27.48 |
| 10 | 22.1 | 55.4 | 2.523 | 272.37 | 63.66 | 18.04 | 23.37 |
| 20 | 22.0 | 49.8 | 2.079 | 251.88 | 43.22 | 16.36 | 17.16 |
| 40 | 22.0 | 46.8 | 1.426 | 241.08 | 20.33 | 13.08 | 8.43 |
| 60 | 22.1 | 46.1 | 1.090 | 238.89 | 11.88 | 10.75 | 4.97 |
| 80 | 22.2 | 45.9 | 0.891 | 238.50 | 7.94 | 9.00 | 3.33 |
| 100 | 22.2 | 45.7 | 0.163 | 237.78 | 5.82 | 7.65 | 2.45 |
| 150 | 22.3 | 45.6 | 0.581 | 237.75 | 3.38 | 5.28 | 1.42 |
| 200 | 22.3 | 45.5 | 0.486 | 237.39 | 2.36 | 3.73 | 0.99 |
| 250 | 22.4 | 45.5 | 0.428 | 237.72 | 1.83 | 2.63 | 0.77 | where $R_{var}$ is the resistance of the variable resistance device 116, $I_{bias}$ is the bias current, $I_{bat}$ is the current from the battery, $V_0$ is the output voltage, $P_{out}$ is the output power, Eff. % is the efficiency of the power amplifier 100, and $P_{disp}$ defined by:

$$P_{disp} = (3.3\ V \times I_{bias}) + (3.6\ V \times I_{bat}).$$

The total current and efficiency of the power amplifier were found to be as follows in Table 2 for the desired various output power levels:

TABLE 2

| Total Current | Efficiency | Output Power |
|---|---|---|
| 90.0 mA | 36.9% | +20.7 dBm |
| 92.2 mA | 39.5% | +21.1 dBm |
| 94.9 mA | 40.5% | +21.3 dBm |
| 99.3 mA | 41.3% | +21.6 dBm |

The total current, $I_{total}$, is equal to the combination of $I_{bias}$ and $I_{bat}$. The calculated output power of the non-linear power amplifier as a function of the input power is shown in Table 3:

TABLE 3

| $V_{in}$ (Vp) | $V_{out}$ (Vp) | $I_{bias}$ (mA) | $I_{bat}$ (mA) | $P_{in}$ (dBm) | $P_{out}$ (dBm) | $P_{disp}$ (mW) | $P_{out}$ (mW) | Eff. % |
|---|---|---|---|---|---|---|---|---|
| 0.079 | 1.330 | 22.900 | 67.100 | −12.05 | 12.47 | 317.13 | 17.68 | 5.57 |
| 0.100 | 1.626 | 22.900 | 67.100 | −10.00 | 14.22 | 317.13 | 26.42 | 8.33 |
| 0.125 | 1.940 | 22.900 | 67.100 | −8.06 | 15.76 | 317.13 | 37.64 | 11.87 |
| 0.162 | 3.421 | 22.900 | 67.100 | −5.81 | 20.68 | 317.13 | 117.03 | 36.90 |

TABLE 3-continued

| $V_{in}$ (Vp) | $V_{out}$ (Vp) | $I_{bias}$ (mA) | $I_{bat}$ (mA) | $P_{in}$ (dBm) | $P_{out}$ (dBm) | $P_{disp}$ (mW) | $P_{out}$ (mW) | Eff. % |
|---|---|---|---|---|---|---|---|---|
| 0.200 | 3.579 | 24.800 | 67.400 | −3.98 | 21.08 | 324.48 | 128.09 | 39.48 |
| 0.251 | 3.673 | 27.500 | 67.400 | −2.01 | 21.30 | 333.39 | 134.91 | 40.47 |
| 0.315 | 3.792 | 31.100 | 68.200 | −0.03 | 21.58 | 348.15 | 143.79 | 41.30 |

Figure 4:
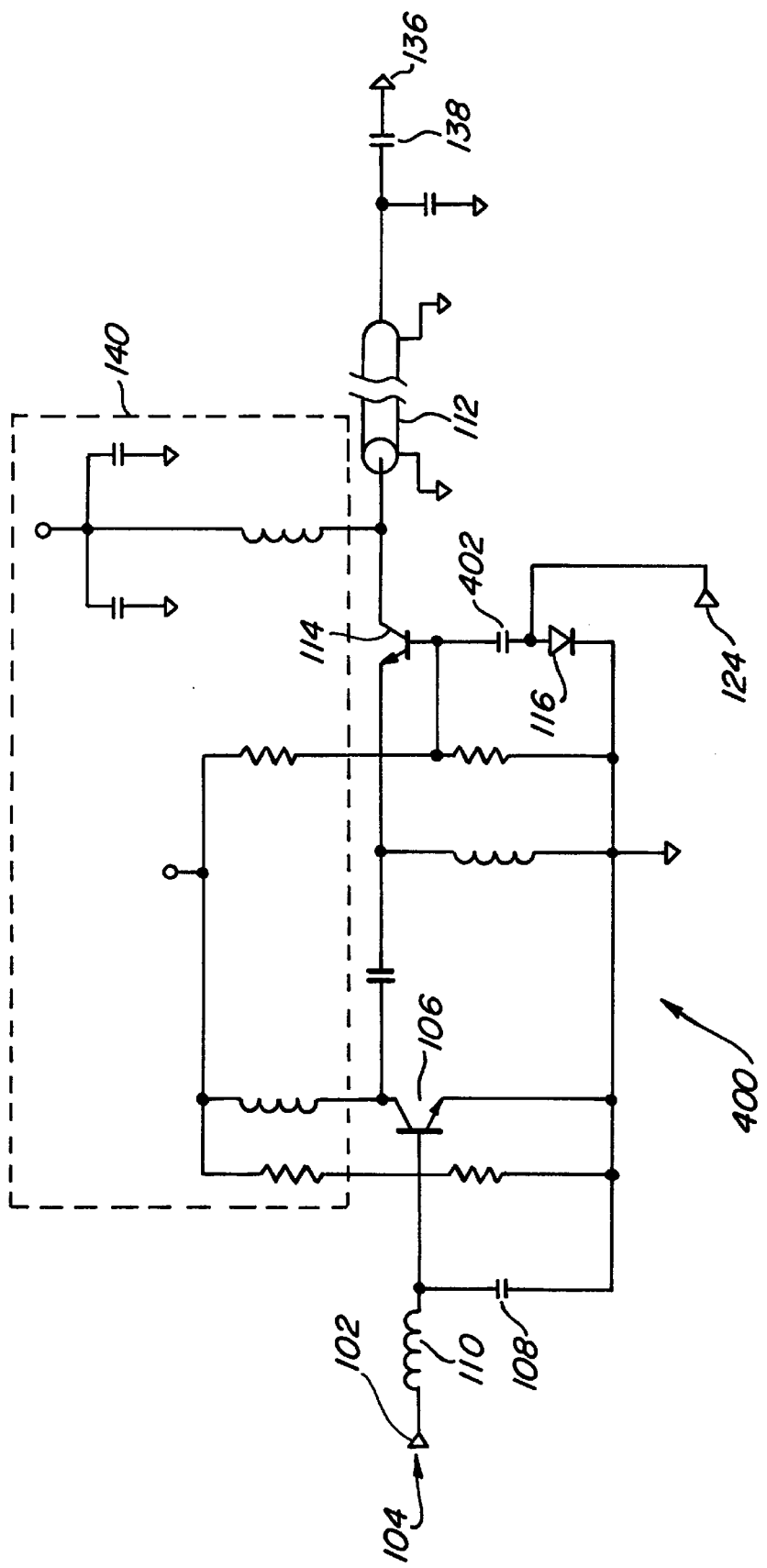
FIG. 4 is a circuit diagram of another preferred embodiment of the non-linear power amplifier of the present invention.

Referring now to FIG. 4, another preferred embodiment of the non-linear power amplifier 400 of the present invention is illustrated. The non-linear power amplifier 400 functions similarly as the power amplifier 100 described above, and a discussion of similarly numbered components will be omitted from this description. In this embodiment, the amplitude envelope 124 is reintroduced into the amplified constant envelope phase modulation component 104 at a low current point 402 between the base 122 of the final amplifier 114 and the variable resistance device 116, where the amplitude envelope 124 passes through a capacitor 404 as it travels to base 122. In this embodiment, the second diode 130 has been eliminated from the circuit. Meanwhile, the introduction of the amplified constant envelope phase modulation component 104 at low current point 402 allows the final amplifier to operate in an efficient, low current consumption, non-linear mode similar to non-linear power amplifier 100.

By operating in a non-linear power mode, a significant reduction in current consumption by the power amplifier 100 is achieved as compared to operating a linear power amplifier. The lower current consumption of the power amplifier 100 increases the life of the battery supplying power to the power amplifier. For instance, in wireless telephones, the available talk time of a wireless handset utilizing the power amplifier 100 of the present invention will be increased over handsets having linear power amplifiers using the same power supply. Alternatively, the lower current consumption of the non-linear power amplifier of the present invention allows the size of the battery to be reduced while achieving the same talk time as handsets having linear power amplifiers.

As can be seen from the foregoing, a non-linear power amplifier formed in accordance with the present invention operates in an efficient, low current consumption manner. Moreover, by forming a non-linear power amplifier in accordance with the present invention, a modulation signal can be amplified without causing unnecessary distortion in the signal by only amplifying a constant envelope phase component of the modulation signal and reintroducing the amplitude envelope of the modulation signal into the amplified constant envelope phase component at the output of the power amplifier. Thus, the non-linear power amplifier can be utilized in a wireless telephone handset to reduce the current consumption of the handset, thus allowing the talktime of the handset to be increased or the battery size of the handset to be decreased In each of the above embodiments, the structures of the non-linear power amplifier of the present invention are described separately in each of the embodiments. However, it is the full intention of the inventors of the present invention that the separate aspects of each embodiment described herein may be combined with the other embodiments described herein. Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. A non-linear power amplifier for amplifying a constant envelope phase modulation component of a modulation signal and combining an amplitude envelope component of the modulation signal with the amplified constant envelope phase modulation component, comprising:

a first input for receiving a constant envelope phase modulation signal;

a first amplifier means connected to the first input for driving an impedance load;

a second amplifier means connected to the impedance load for controlling the gain of the constant envelope phase modulation signal, wherein the second amplifier means includes a base, an emitter, and a collector;

a variable resistance device connected between the base of the second amplifier and electrical ground for controlling the gain of the second amplifier by variably controlling the base-to-ground resistance of the second amplifier; and a second input means for introducing the amplitude envelope into the constant envelope phase modulation between the base of the second amplifier means and the variable resistance device.

2. The non-linear power amplifier of claim 1, wherein the first amplifier means is either a Class A or Class AB power amplifier.

3. The non-linear power amplifier of claim 1, wherein the second amplifier means is either a Class C or Class D power amplifier.

4. The non-linear power amplifier of claim 1, wherein the variable resistance device is a pin diode.

5. The non-linear power amplifier of claim 1, wherein the variable resistance means changes the input resistance of the emitter of the second amplifier means as the base-to-ground resistance is changed.

6. The non-linear power amplifier of claim 1, wherein the variable resistance means controls the gain of the second amplifier means by varying the base-to-ground resistance in order to vary the pulse width, gain and power output of constant envelope phase modulation signal.

7. The non-linear power amplifier of claim 1, wherein the impedance load performs an impedance transformation to match the impedance of a collector of the first amplifier means with the emitter of the second amplifier means.

8. The non-linear power amplifier of claim 8, wherein the impedance load performs an impedance transformation of 90 degrees to transduce the impedance to low source impedance to drive the emitter of the second amplifier means.

9. An improved method of amplifying a modulation signal in a non-linear power amplifier in an efficient, low-current manner, comprising the steps of:

separating the modulation signal into a constant envelope modulation component and an amplitude envelope component;

introducing the constant envelope modulation component of the modulation signal into the non-linear power amplifier; wherein the non-linear power amplifier includes first and second amplifiers with each of the amplifiers including an emitter, collector, and base;

feeding the a constant envelope modulation component of the modulation signal through the first and second amplifiers;

variably controlling the gain of the second amplifier by varying the resistance between the base of the second amplifier and electrical ground, wherein a variable resistance device is positioned between the base of the second amplifier and electrical ground;

introducing the amplitude envelope of the modulation signal into the amplified constant envelope modulation component between the base of the second amplifier and electrical ground in order to recreate the modulation signal having both phase and amplitude components.

10. The method of modulating and transmitting a signal in a wireless transmission system of claim 9, where in the second amplifier is either a Class C or Class D non-linear power amplifier.

11. The method of modulating and transmitting a signal in a wireless transmission system of claim 9, wherein the variable resistance device is a pin diode.

12. The method of modulating and transmitting a signal in a wireless transmission system of claim 9, wherein the input resistance of the emitter of the second amplifier changes as the base-to-ground resistance of the second amplifier is changed.

13. The method of modulating and transmitting a signal in a wireless transmission system of claim 9, further comprising the step of matching the impedance of the collector of the first amplifier with the emitter of the second amplifier.

14. The method of modulating and transmitting a signal in a wireless transmission system of claim 13, wherein an impedance load is positioned between the first and second amplifiers to match the impedance between the first and second amplifiers, such that the first amplifier drives the impedance load.

* * * * *